(12) United States Patent
Torrents Abad

(10) Patent No.: US 10,998,480 B2
(45) Date of Patent: May 4, 2021

(54) LIGHT-EMITTING STRUCTURE ALIGNMENT PRESERVATION IN DISPLAY FABRICATION

(71) Applicant: Facebook Technologies, LLC, Menlo Park, CA (US)

(72) Inventor: Oscar Torrents Abad, Cork (IE)

(73) Assignee: FACEBOOK TECHNOLOGIES, LLC, Menlo Park, CA (US)

(*) Notice: Subject to any disclaimer, the term of this patent is extended or adjusted under 35 U.S.C. 154(b) by 0 days.

(21) Appl. No.: 16/388,770

(22) Filed: Apr. 18, 2019

(65) Prior Publication Data

US 2020/0091386 A1 Mar. 19, 2020

Related U.S. Application Data

(60) Provisional application No. 62/733,399, filed on Sep. 19, 2018.

(51) Int. Cl.
| | |
|---|---|
| *H01L 33/62* | (2010.01) |
| *H01L 21/683* | (2006.01) |
| *H01L 25/075* | (2006.01) |
| *H01L 33/32* | (2010.01) |
| *H01L 33/30* | (2010.01) |

(52) U.S. Cl.
CPC .......... *H01L 33/62* (2013.01); *H01L 21/6835* (2013.01); *H01L 25/0753* (2013.01); *H01L 33/30* (2013.01); *H01L 33/32* (2013.01); *H01L 2221/68368* (2013.01); *H01L 2933/0033* (2013.01)

(58) Field of Classification Search
CPC ......... H01L 33/62; H01L 33/30; H01L 33/32; H01L 21/6835; H01L 25/0753; H01L 2221/68368; H01L 2933/0033
See application file for complete search history.

(56) References Cited

U.S. PATENT DOCUMENTS

| | | | | |
|---|---|---|---|---|
| 5,081,520 A | * | 1/1992 | Yoshii | H01L 21/563 257/702 |
| 8,558,360 B2 | * | 10/2013 | Kim | H01L 24/31 257/669 |
| 8,841,783 B2 | * | 9/2014 | Wakiyama | H01L 21/561 257/797 |
| 2002/0119597 A1 | | 8/2002 | Mastromatteo | |
| 2011/0074026 A1 | | 3/2011 | Shim et al. | |
| (Continued) | | | | |

FOREIGN PATENT DOCUMENTS

| | | |
|---|---|---|
| WO | 2016060677 A1 | 4/2016 |
| WO | 2020060840 A1 | 3/2020 |

OTHER PUBLICATIONS

International Application No. PCT/US2019/050842, International Search Report and Written Opinion dated Nov. 26, 2019, 9 pages.

*Primary Examiner* — Mark W Tornow
(74) *Attorney, Agent, or Firm* — Weaver Austin Villeneuve & Sampson LLP

(57) ABSTRACT

Techniques are disclosed for forming a frame on the backplane comprising structures at least partially circumscribing or enclosing metal contacts on the backplane. In some embodiments, the frame may comprise a photoresist. The dimensions and structural integrity of the frame can help prevent misalignment and/or damage of physical obtrusions of light-emitting structures during a bonding process of the light-emitting structures to the backplane.

12 Claims, 16 Drawing Sheets

(56) References Cited

U.S. PATENT DOCUMENTS

2012/0126395 A1\* 5/2012 Lee .................... H01L 23/3128
257/737
2012/0286418 A1  11/2012 Lee et al.

\* cited by examiner

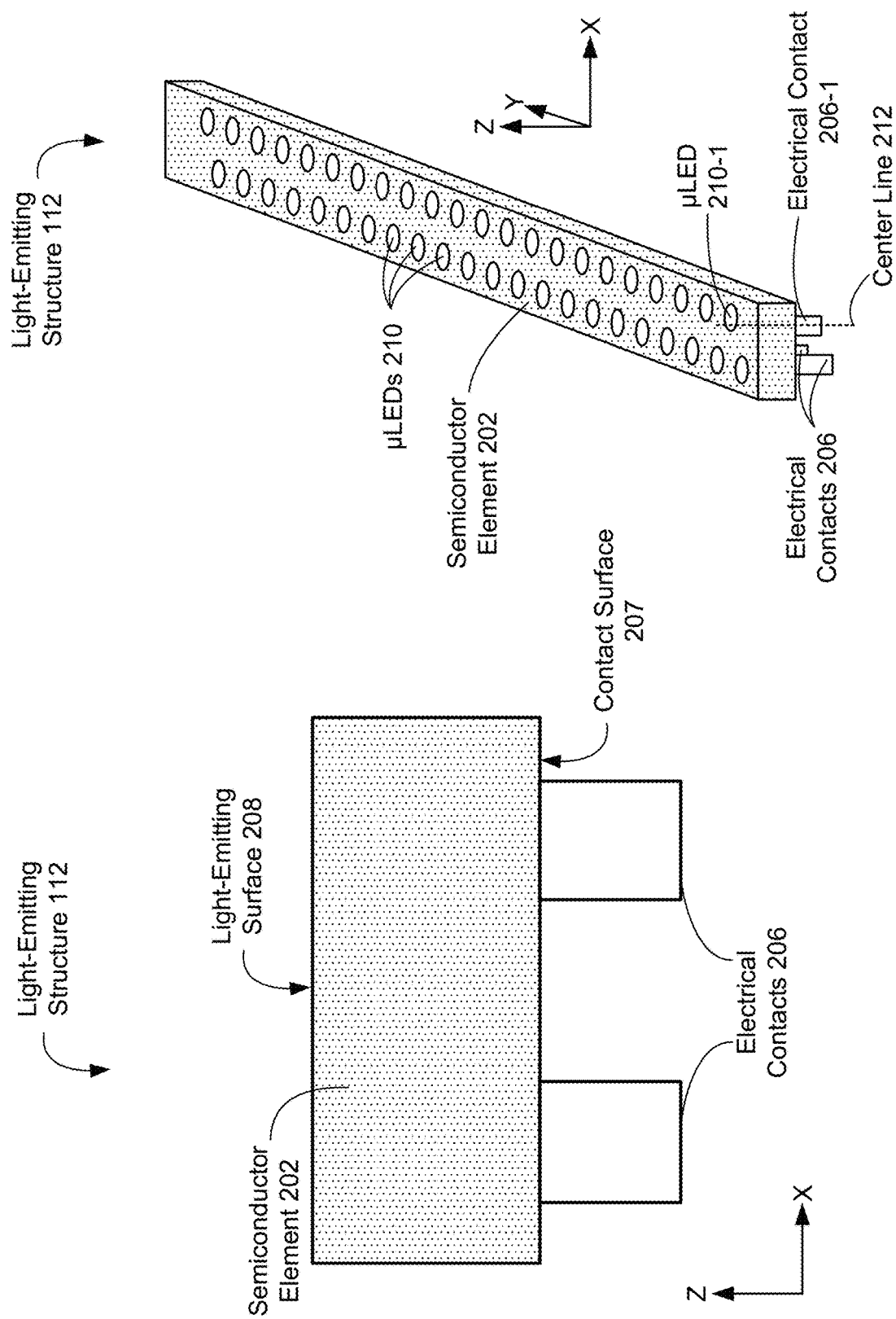

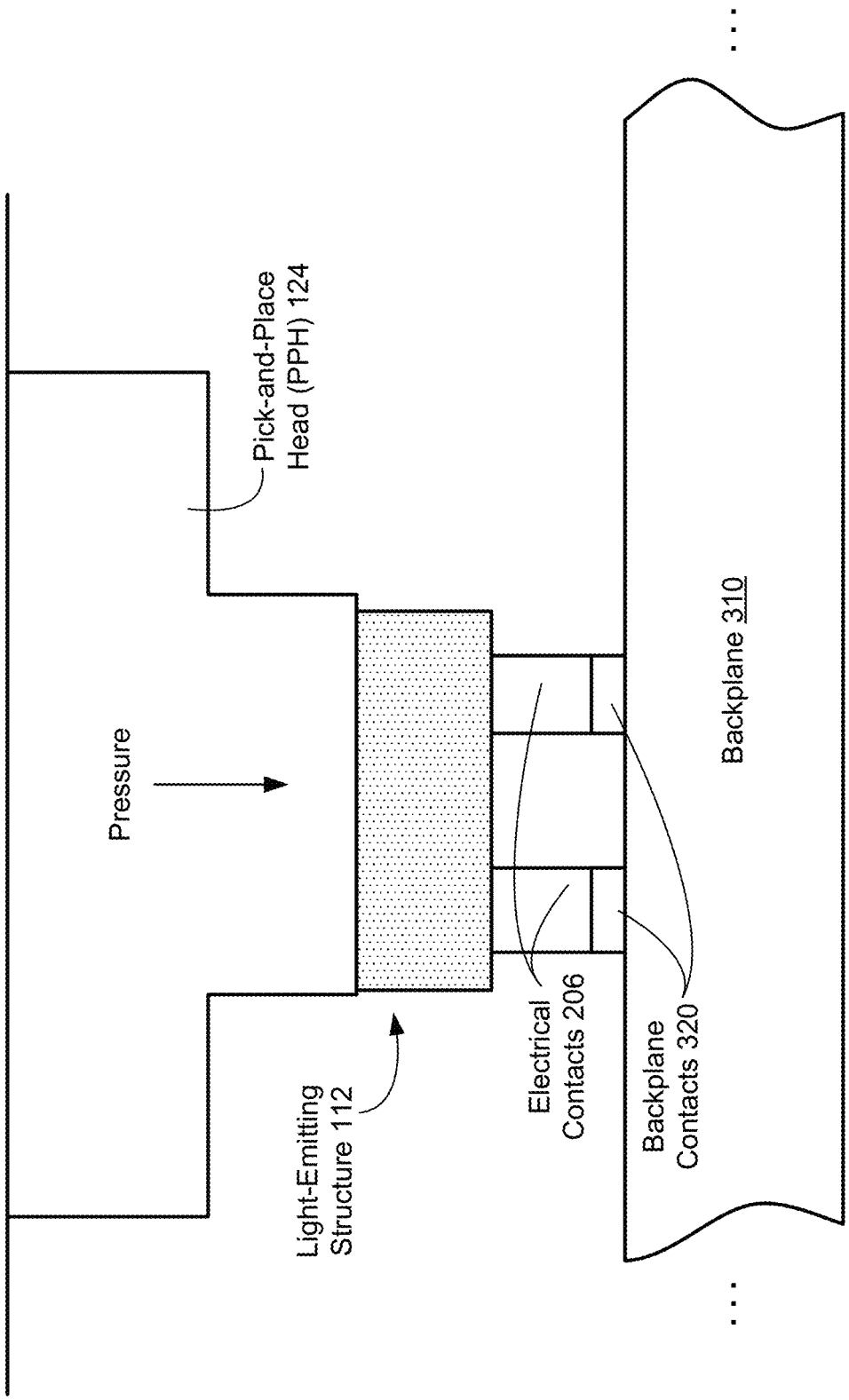

US 10,998,480 B2

LIGHT-EMITTING STRUCTURE ALIGNMENT PRESERVATION IN DISPLAY FABRICATION

CROSS-REFERENCE TO RELATED APPLICATIONS

This application claims the benefit of U.S. Provisional Application No. 62/733,399, filed Sep. 19, 2018, entitled "Light-Emitting Structure Alignment Preservation In Display Fabrication", which is assigned to the assignee hereof, and incorporated herein by reference in its entirety.

BACKGROUND

Modern electronics such as virtual reality (VR), augmented reality (AR), and/or mixed reality (MR) devices, may include displays with very small light-emitting diodes (LEDs). According to some techniques, the manufacture of these displays may involve bonding light-emitting structures (comprising one or more LEDs) to a backplane, or display substrate.

SUMMARY

Embodiments address these and other issues by utilizing techniques for forming a frame on the backplane comprising structures at least partially circumscribing or enclosing the metal interconnects on the backplane. In some embodiments, the frame may comprise a photoresist. The dimensions and structural integrity of the frame can help prevent misalignment and/or damage of physical obtrusions of the light-emitting structures during the bonding process.

An example method of manufacturing a display, according to the description, comprises providing a backplane comprising a planar surface, a first set of electrical contacts coupled to the planar surface, and one or more frame structures coupled to the planar surface, the one or more frame structures at least partially enclosing the first set of electrical contacts and configured to restrict movement of at least a portion of a light-emitting structure during bonding of the light-emitting structure to the backplane. The method further comprises obtaining the light-emitting structure, the light-emitting structure comprising a semiconductor element with a contact surface, and a second set of electrical contacts coupled to the contact surface. The method also comprises placing the light-emitting structure on the backplane such that each electrical contact of the second set of electrical contacts is in physical contact with a respective electrical contact of the first set of electrical contacts; and bonding the light-emitting structure to the backplane, the bonding comprising heating the light-emitting structure and the backplane, and applying a force to press the light-emitting structure to the backplane.

An example backplane, according to the description, comprises a planar surface, a first set of electrical contacts coupled to the planar surface, and one or more frame structures on the surface of the backplane at least partially enclosing the first set of electrical contacts and configured to, during a bonding process in which each electrical contact of a second set of electrical contacts comprising one or more contacts of a light-emitting structure is bonded with a respective electrical contact of the first set of contacts, come in physical contact with a surface of a semiconductor element of the light-emitting structure.

BRIEF DESCRIPTION OF THE DRAWINGS

Illustrative embodiments are described with reference to the following figures.

FIG. 2A is a cross-sectional view of a schematic diagram of a light-emitting structure, according to an embodiment.

FIG. 2B is a perspective view of a light-emitting structure, according to an embodiment.

FIGS. 3A-3C are cross-sectional diagrams illustrating different stages of a process of manufacturing a display device, according to one embodiment.

Figure 1:
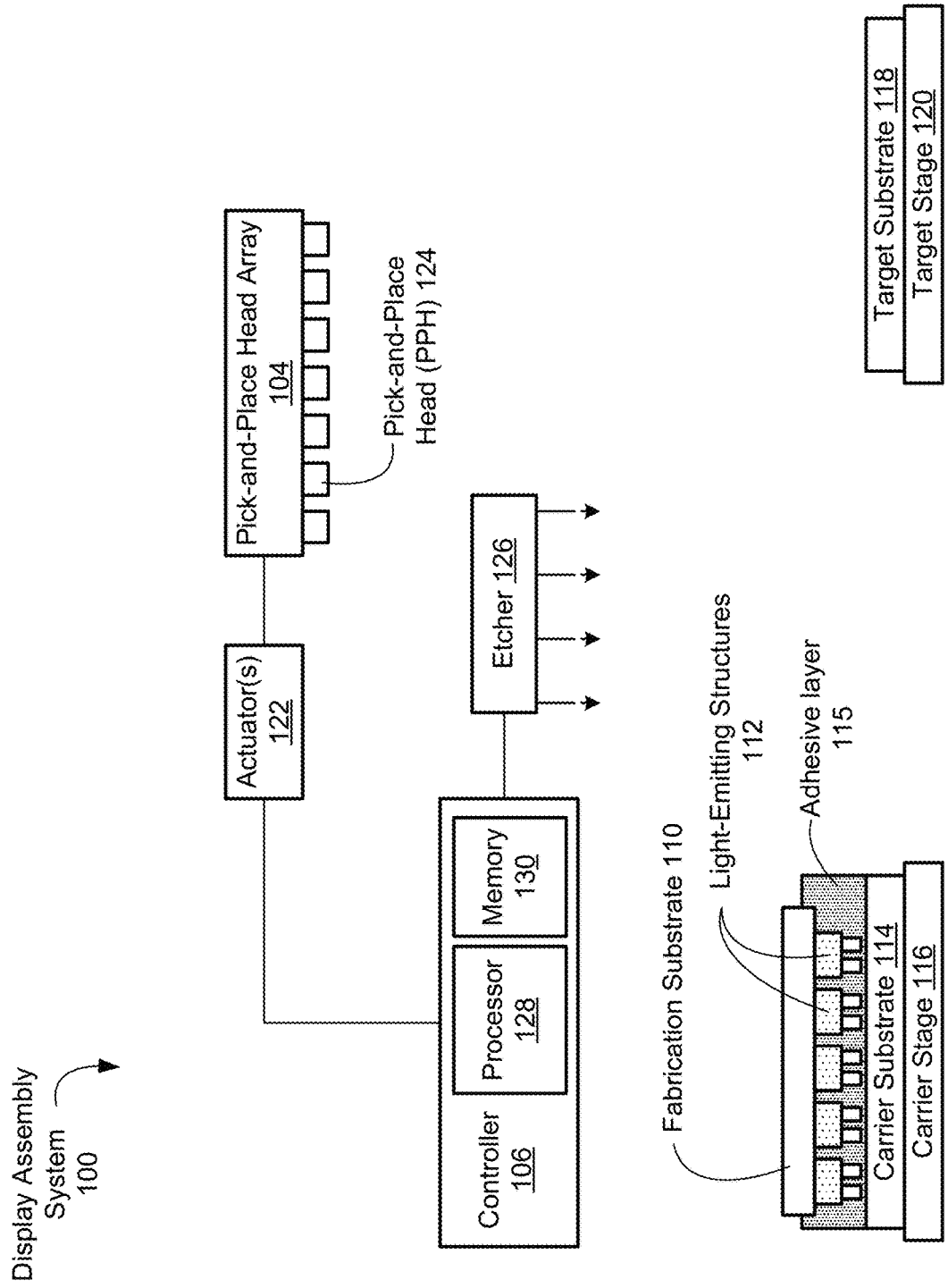
FIG. 1 is a simplified illustration of a display assembly system, according to an embodiment.

The figures depict embodiments of the present disclosure for purposes of illustration only. One skilled in the art will readily recognize from the following description that alternative embodiments of the structures and methods illustrated may be employed without departing from the principles of, or benefits touted in, this disclosure. Coordinate frames including two or three mutually orthogonal axes (e.g., XY, XZ, and/or XYZ axes) have been included in some figures, to help illustrate how components illustrated in these figures may be oriented, relative to other figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. Additionally, where a figure may illustrate multiple components and/or features of the same type, only a portion of the components and/or features may be labeled in some instances, to avoid clutter in the figure.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

In the manufacture of VR, MR, AR, and/or similar displays, issues can arise during the bonding process. For example, metal contacts on the light-emitting structures may become misaligned with corresponding metal interconnects on the backplane. Additionally or alternatively, the pressure applied to the light-emitting structures and/or backplane during the bonding process may damage physical obtrusions of the light-emitting structures (e.g., LED mesas) on or near the metal interconnects. Embodiments disclosed herein address these and other issues by utilizing techniques for forming a frame on the backplane comprising structures at least partially circumscribing or enclosing the metal interconnects on the backplane.

Embodiments are described herein with reference to the figures, where like reference numbers indicate identical or functionally similar elements. Also in the figures, the left most digit of each reference number corresponds to the figure in which the reference number is first used.

As used herein, a micro-LED (or "μLED") may refer to an LED that has an active light-emitting area with a linear dimension that is less than 50 μm, less than 20 μm, or less than 10 μm. For example, the linear dimension may be as small as 2 μm or 4 μm. As shown in FIG. 2B and described herein, light-emitting structures may comprise multiple μLEDs.

FIG. 1 is a simplified illustration of a display assembly system 100, according to one embodiment. The display assembly system 100 fabricates a display device through a pick-and-place technique. Specifically, the display assembly system 100 assembles a display by picking up light-emitting structures, which may comprise micro-LEDs (μLEDs), from a carrier substrate 114, and places them onto a target substrate 118. In some embodiments, the light-emitting structures 112 are LED dies that emit a different color. In some embodiments, the light-emitting structures 112 are different color μLEDs having a reduced divergence of light output and a small light-emitting area. The carrier substrate 114, or "hard handle," may comprise a glass substrate or similar structure that holds the light-emitting structures 112 for pick up by the pick-and-place array 104. The pick-and-place array 104, or pick-up head, may be referred to as a pick and place head (PPH) array or pick up tool (PUT). In other embodiments, the carrier substrate 114 may comprise the native substrate on which the light-emitting structures 112 are grown. Alternatively, as discussed in further detail below, the light-emitting structures 112 may be grown on a fabrication substrate and attached to the carrier substrate 114 via an adhesive layer 115, in which case the fabrication substrate 110 may be removed and the adhesive layer 115 may be (completely or partially) removed to enable extraction of the light-emitting structures 112 from the carrier substrate 114.

The target substrate 118 may be a backplane, or may be an intermediate carrier substrate that facilitates bonding with a backplane. The display assembly system 100 places light-emitting structures 112 at locations of the backplane, and then bonds the light-emitting structures 112 to the backplane. As used herein, the terms "backplane" and "display substrate" are used to describe a substrate on which one or more light-emitting structures 112 are placed and bonded during display manufacture. As such, a backplane may provide physical support and electrical connectivity for the one or more light-emitting structures 112.

As shown, the display assembly system 100 further includes a pick-and-place array 104, an actuator 122, a carrier stage 116, and a target stage 120. The carrier stage 116 holds a carrier substrate 114 having one or more light-emitting structures 112. The target stage 120 holds a target substrate 118 to receive some or all of the light-emitting structures 112 from the carrier substrate 114.

A controller 106 may be communicatively coupled with the pick-and-place array 104 (e.g., via the actuator 122) and control the operations of the pick-and-place array 104. For example, the controller 106 causes the pick-and-place array 104 to pick up one or more light-emitting structures 112 located on a carrier substrate 114, and place the one or more semiconductor devices on the target substrate 118. The controller 106 may include, among other components, a memory 130 and a processor 128. The memory 130 stores instructions for operating the pick-and-place array 104. The memory 130 may be any memory storage, such as an SRAM, DRAM, ROM, or any other computer memory storage. The processor 128 executes the instructions stored in the memory 130 and sends out the instructions to the pick-and-place array 104 via a signal interface (not shown). The processor 128 may cause the display assembly system 100 to perform the methods described in further detail with reference to FIGS. 13 and 14.

The pick-and-place array 104 includes a plurality of pick-up heads 124. Each pick-up head (PPH) 124 can pick up a light-emitting structure 112 from the carrier substrate 114, and place the semiconductor device on the target substrate 118. After picking up a light-emitting structure 112, the PPH 124 may be aligned with a location on the target substrate 118.

The actuator 122 may comprise an electro-mechanical component that controls the movement of the pick-and-place array 104 based on instructions from the controller 106, as executed by the processor 128 from instructions stored in memory 130, and thus controls the transfer of the light-emitting structure 112 from carrier substrate 114 and placement on the target substrate 118. For example, the actuator 122 may move the pick-and-place array 104, or individual PPHs 124, with three degrees of freedom including up and down, left and right, and forward and back. In some embodiments, the pick-and-place array 104 has more than three degrees of freedom. For example, the pick-and-place array 104 may have six degrees of freedom, allowing for lateral motion up and down, left and right, and forward and back, as well as rotational motion along three different axes. The actuator 122 may be embodied, for example, as a rotating motor, a linear motor, or a hydraulic cylinder.

The controller 106 may align the one or more PPHs 124 with the target substrate 118, and place the light-emitting structures 112 attached to the one or more PPHs 124 on the target substrate 118.

The display assembly system 100 may include one or more carrier substrates 114. For example, different carrier substrates 114 may carry different color LED dies. A carrier substrate 114 may be carrier film that holds singulated light-emitting structures 112 for transfer to the target substrate 118. The system may include one or more target substrates 118. In some embodiments, such as when the target substrate 118 comprises the backplane for receiving the light-emitting structures 112, the target stage 120 may include a heater for thermal conductive bonding of the electrical contact pads of the light-emitting structures 112 to the target substrate 118 subsequent to placement of the light-emitting structures 112 on the target substrate 118 by the pick-and-place array 104. In other embodiments, the display assembly system 100 may include a laser system for laser bonding of the electrical contact pads of the light-emitting structures 112 to the target substrate 118 subsequent to placement of the light-emitting structures 112 on the target substrate 118 by the pick-and-place array 104.

In some embodiments, the display assembly system 100 may comprise multiple pick-up head arrays 104 each positioned at a separate station. Each station may be dedicated to the pick-and-place array of a particular color LED, such as a green station for green LEDs, a red station for red LEDs, and a blue station for blue LEDs, etc. Different colored LEDs are grown on different native substrates, which may be different carrier substrates 114 as shown in FIG. 1, due to differences in their composition and structure.

In embodiments in which the light-emitting structures 112 comprise μLEDs, creating enough Van der Waals force between the pick-up surface of the light-emitting structures 112 and the PPH 124 is important, since the small surface of the μLEDs reduces the surface area over which the Van der Waals interactions can occur. Furthermore, during movement of the carrier substrate 114 (e.g., to move the light-emitting structures 112 to another location during the course of display manufacture), the light-emitting structures 112 are ideally secured, so that when the PPH 124 comes into contact with the pick-up surface of the light-emitting structures 112, the two surfaces align and there is minimal tilting of the light-emitting structures 112. Using an adhesive layer 115 on the carrier substrate 114 as described in FIGS. 3A-5C, the pick-and-place technique of the display assembly system 100 can be used to successfully place light-emitting structures 112 from the carrier substrate 114 to the target substrate 118.

In some embodiments, the force between the pick-up surface of the light-emitting structures 112 and the PPH 124 may be any adhesion force in addition to or other than a Van der Waals force. For example, the PPH 124 may include grippers that grip the light-emitting structures 112 and remove them from the carrier substrate 114. In other examples, the PPH 124 may pick up light-emitting structures 112 using electrostatic forces.

The display assembly system 100 includes an etcher 126. The etcher 126 etches the adhesive layer 115 of the light-emitting structure 112 on the carrier substrate 114 based on instructions received from the controller 106. The adhesive layer 115 is described in further detail with reference to FIGS. 3A-5C. The etcher 126 can etch the adhesive layer 115 without substantially affecting the light-emitting structure 112. The etcher 126 may comprise, for example, an oxygen dry-etcher, such as a Radio Frequency (RF) oxygen plasma reactor. In other embodiments, the etcher 126 may dry-etch an adhesive layer 115 with any gas that selectively removes the adhesive layer 115 without affecting the structure of the light-emitting structure 112. For example, the etcher 126 may use air plasma or ammonia (NH3), chlorine, boron, or fluorocarbon gas or any other gas capable of removing an adhesive layer 115. The etcher 126 may include gas intake and gas outtake valves, ionizing plates, and any other standard etching components.

FIG. 2A is a cross-sectional view of a schematic diagram of a light-emitting structure 112, which may comprise a μLED die, in accordance with one embodiment. The light-emitting structure 112 may include, among others, a semiconductor element 202, and electrical contacts 206. The semiconductor element 202 may, in some embodiments, comprise semiconducting material made by epitaxial growth (epitaxy), such as gallium nitride (GaN), gallium arsenide (GaAs), or the like. The electrical contacts 206 serve as interconnects for the light-emitting structure 112 when the light-emitting structure 112 is mounted to a backplane.

The electrical contacts 206 may be provided in the form of bumps or microbumps, for interconnection of the light-emitting structure 112 to an electrical conductor. The electrical contacts may be arranged on a surface of the light-emitting structure 112 and may be formed on top of the p- and n-contacts of an LED in the semiconductor element 202, which may be arranged on a single side of the semiconductor element 202, such as a contact surface 207 opposite to the light-emitting surface 208. The electrical contacts 206 may be made of a metal (e.g., copper (Cu), tin (Sn), gold (Au), nanoporous Au, nanoporous Cu, and/or other metals) and/or non-metal structures such as carbon nanotubes or conductive polymers to interconnect to metal pads (e.g., comprising Au, Cu, or nanoporous Au, for example) on electrical conductors on a backplane. In some embodiments, a single electrical contact 206 for an LED (e.g., the anode) may be located near the LED (e.g., on a surface opposite the light-emitting surface of the LED), and the other electrical contact 206 (e.g., the cathode) may be electrically connected with other LEDs in the light-emitting structure, forming a common electrical contact 206, which may be located elsewhere (e.g., at an end of the light-emitting structure 112).

FIG. 2B is a perspective view of a light-emitting structure 112, according to an embodiment. Here, the light-emitting structure 112 comprises a die having two rows of offset μLEDs 210 (which effectively may comprise a single output row in the resulting display, depending on desired functionality). That is, rows may be offset to provide a more compact horizontal (or vertical) output pitch in the resulting display. Additionally, as illustrated in FIG. 2B, electrical contacts 206 may be slightly offset from corresponding μLEDs 210. That is, depending on manufacturing and/or other concerns, the center of an electrical contact 206-1 may not align with the center of a corresponding μLED 210-1 to which the electrical contact 206-1 is electrically connected, as illustrated by the center line 212.

It can be noted that, alternative embodiments may vary from the embodiment illustrated in FIG. 2B. For example, μLEDs 210 (or other light-emitters) may be arranged differently on the light-emitting structure 112, the light-emitting structure 112 may have a different shape, there may be more or fewer rows (including only a single row) of μLEDs 210, μLEDs 210 may have two contacts each (e.g., rather than sharing a common electrical contact among multiple μLEDs 210) and/or there may be more or fewer μLEDs 210 (including only a single μLED 210), etc. A person of ordinary skill in the art will appreciate other such variations.

It can be noted that FIGS. 2A and 2B are simplified drawings provided for illustrative purposes. Embodiments of a light-emitting structure 112 may comprise additional features not explicitly shown in FIGS. 2A and 2B, or other figures herein. For example, embodiments may include one or more obtrusions, or mesas, which may help direct light generated by the light-emitting structure 112. As described below, some embodiments may include mesas located on a surface opposite the light-emitting surface 208. In such embodiments, an electrical contact 206 may be located on or near a mesa.

Figure 3A:
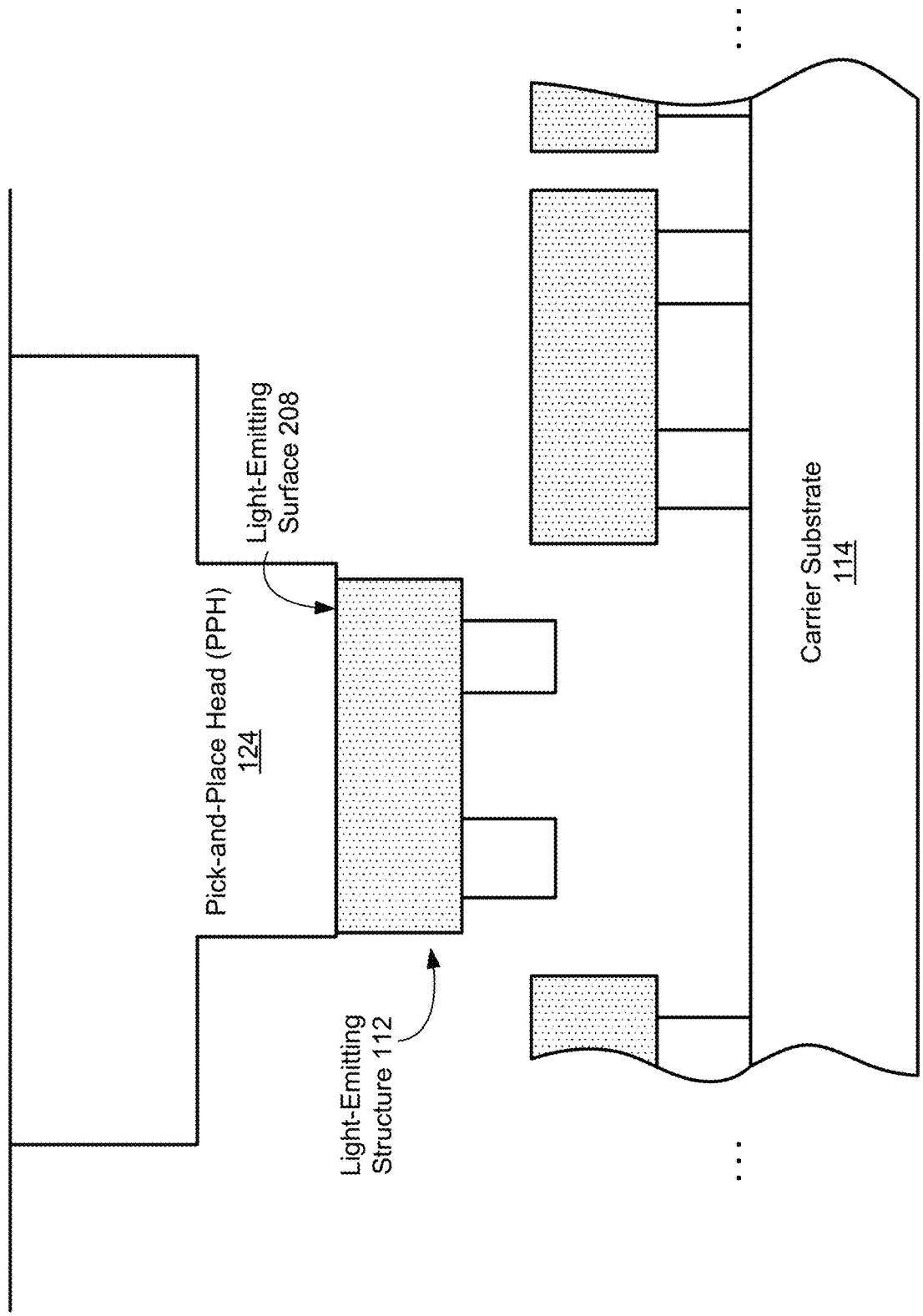
Figure 3B:
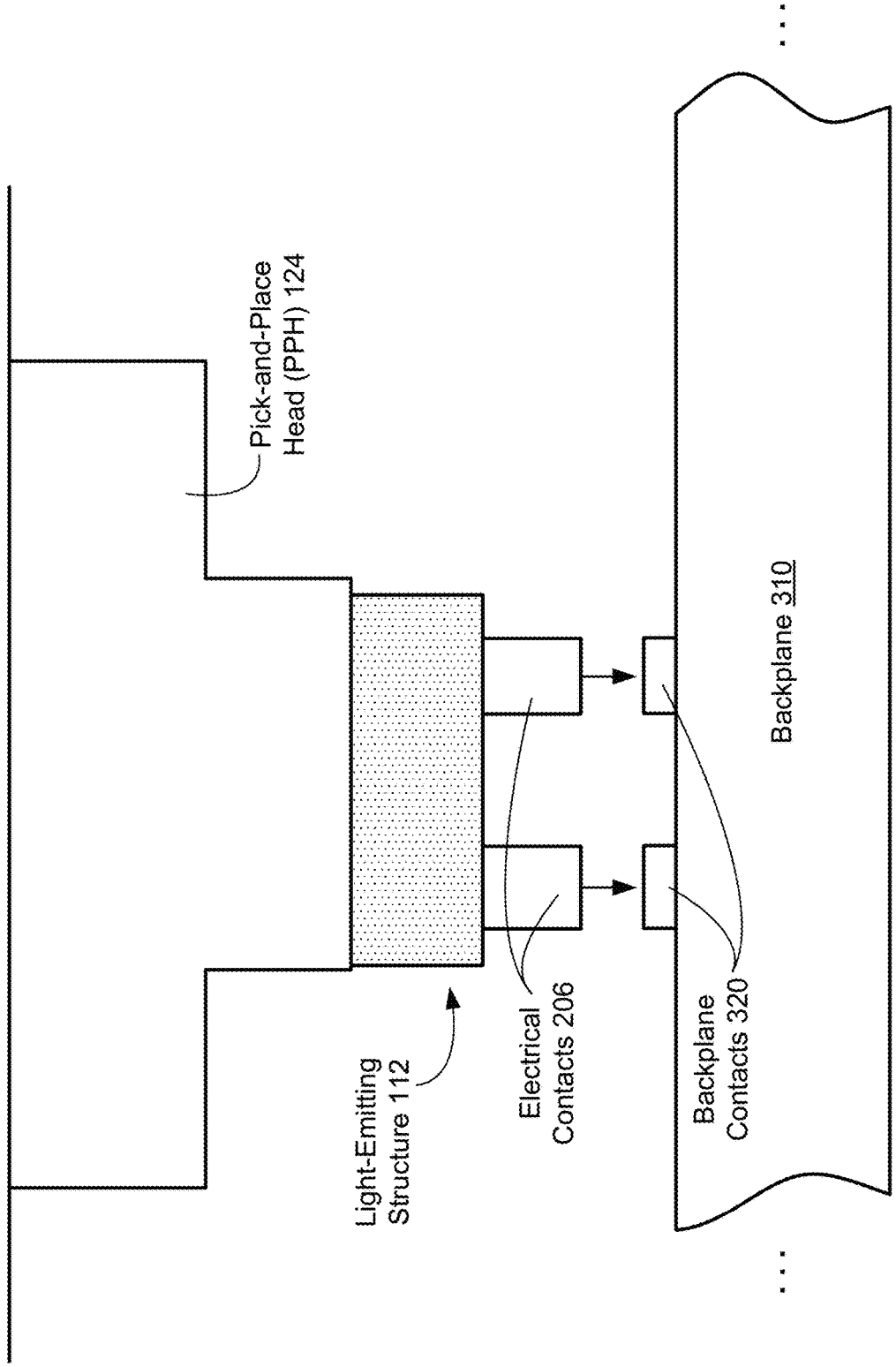

FIGS. 3A-3C are cross-sectional diagrams illustrating different stages of a process of manufacturing a display device, according to one embodiment, which may be performed by a display assembly system, such as the display assembly system 100 of FIG. 1. The stages illustrated in FIGS. 3A-3C can be performed after singulation of the light-emitting structures 112, once the fabrication substrate 110 and adhesive layer 115 have been removed and the light-emitting structures 112 are ready to be placed on and bonded to a backplane (which may comprise the target substrate 118 of FIG. 1).

The electrical connections formed by the bonding of the light-emitting structures 112 and backplane contacts of the backplane (backplane contacts 320 illustrated in FIGS. 3B-3C) help ensure proper functionality of the display. Without a proper bond, for example, this display would be unable to power the micro LEDs of the light-emitting structures 112, and therefore the display may be unable to operate properly. As such, ensuring proper bonding can be important in the process of fabricating a display.

FIG. 3A illustrates a stage in which a light emitting structure 112 is decoupled from the carrier substrate 114 using a PPH 124. In some embodiments, an elastomer layer (not shown) may be deposited or otherwise formed on the light-emitting surface 208 of the light emitting structure 112, which can facilitate the attachment of light-emitting structure 112 to the PPH 124 for placement on a target substrate during display manufacture. The composition of the PPH 124 may vary, depending on desired functionality. In some embodiments, the PPH 124 may also comprise an elastomer, a glass, or the like. Additional or alternative materials may be used. Although not illustrated in FIG. 3A, there may be a portion of an adhesive layer (e.g., adhesive layer 115 illustrated in FIG. 1) between the light emitting structure 112 and carrier substrate 114 that may help keep the light emitting structure 112 coupled with the carrier substrate 114 prior to the decoupling of the light emitting structure 112 with the carrier substrate 114 by the PPH 124.

FIG. 3B illustrates a stage, subsequent to the stage illustrated in FIG. 3A, in which the light emitting structure 112 is placed on a backplane 310 for bonding. Here, the electrical contacts 206 of the light emitting structure 112 may be aligned with corresponding backplane contacts 320 of the backplane 310. According to some embodiments, electrical contacts 206 may comprise copper (Cu), tin (Sn), and/or other conductive materials. The backplane contacts 320 may additionally or alternatively comprise Cu and/or other conductive materials. The accuracy of the alignment may vary, depending on the equipment used and/or other factors. In some embodiments, for example, accuracy may be ±1 micron. Other embodiments may include greater or smaller accuracies.

FIG. 3C illustrates a stage, subsequent to the stage illustrated in FIG. 3B, in which the light emitting structure 112 is bonded to the backplane 310. The bonding process may involve the use of temperature, time, and a pressure to bond electrical contacts 206 with backplane contacts 320. According to an embodiment, for example, the components illustrated in FIG. 3C may be heated up to 250-270° C., causing an metal bond to be formed between the electrical contacts 206 and backplane contacts 320. To help ensure proper bonding, a pressure may be applied (e.g., by the PPH 124) to press the light-emitting structure 112 to the backplane 310 during the heating process. Components are then cooled down, and the PPH 124 is then released from the light-emitting structure 112. With the electrical contacts 206 bonded to the backplane contacts 320, the light-emitting structure 112 remains coupled to the backplane 310.

It can be noted that FIGS. 3A-3C are simplified diagrams provided to help illustrate the bonding process with regard to a single light-emitting structure 112. In some embodiments, multiple light emitting structures 112 may be located near each other on the backplane 310. These light emitting structures 112 may be bonded simultaneously (e.g., using multiple PPHs 124 of a PPH array 124) or in series, depending on desired functionality. Moreover, the process of light-emitting structure fabrication and placement illustrated in FIGS. 1-3C and described above may be repeated for different light emitting structures that emit different colored light (e.g., for embodiments in which μLEDs of a single light-emitting structure 112 emit a single color of light). In this manner, monochromatic light-emitting structures 112 of different colors may be placed on a common backplane 310 to form a display having a polychromatic pixel assembly that includes μLEDs that emit, for example, red, green, and blue light.

Figure 4A:
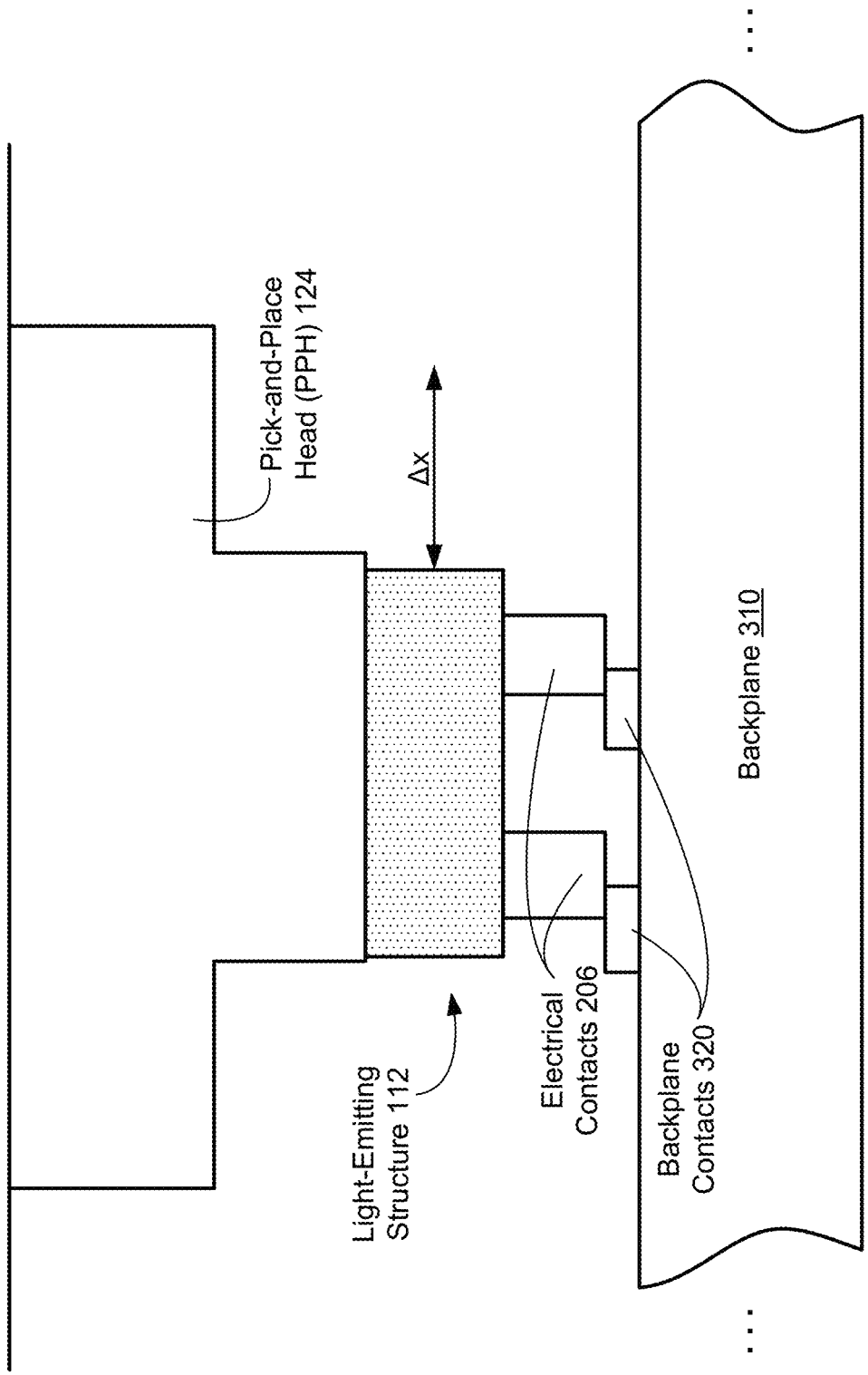
FIGS. 4A and 4B are cross-sectional diagrams of a light-emitting structure and backplane during a bonding process.
Figure 4B:
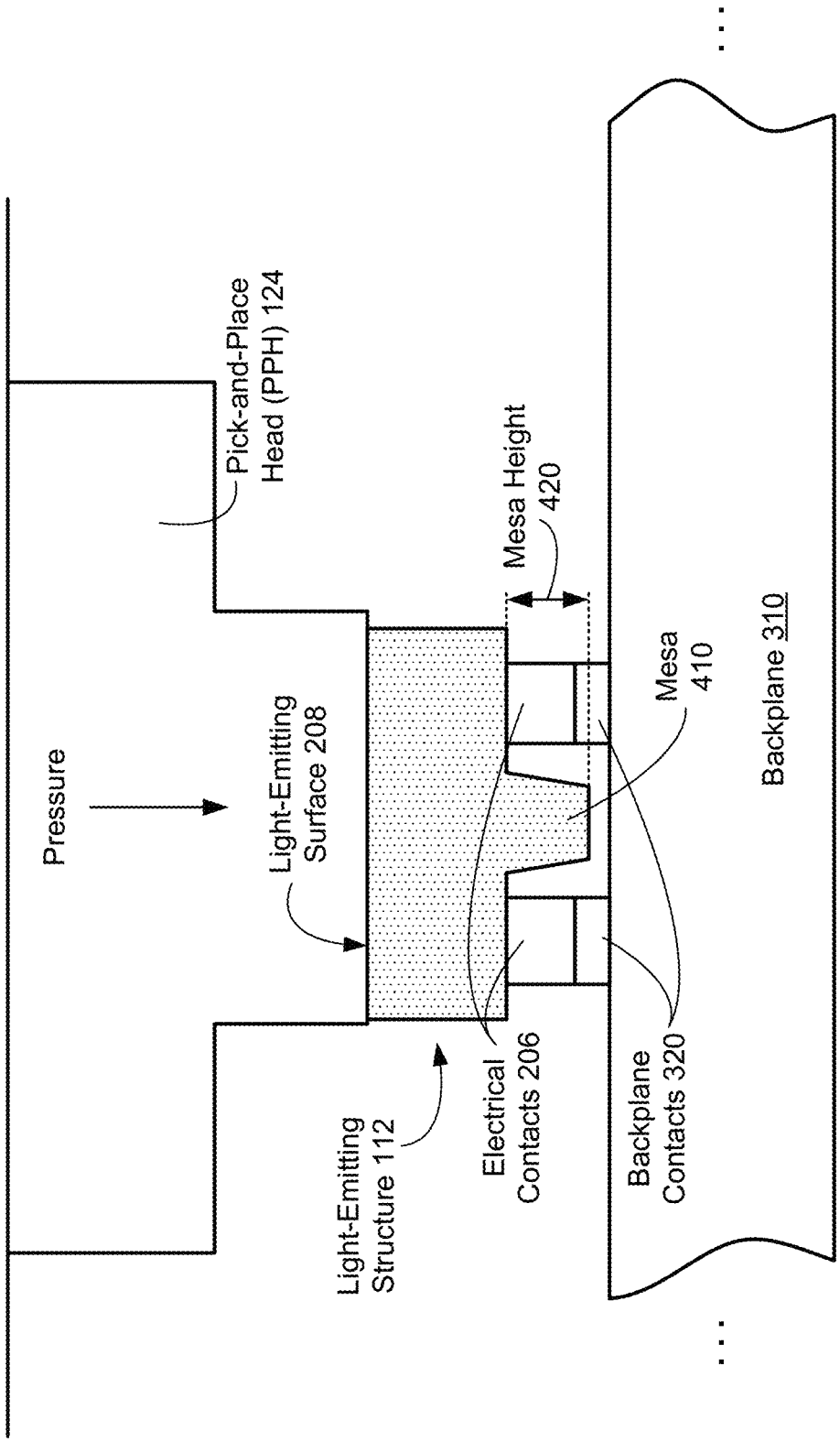

As previously noted, problems may arise during the bonding process illustrated in FIGS. 3A-3C. FIGS. 4A and 4B illustrate to such problems.

FIG. 4A is a diagram of a light emitting structure 112 and backplane 310 during a bonding process in which lateral movement occurs. The materials with which the PPH 124, light-emitting structure 112 (including electrical contacts 206), and backplane 310 (including backplane contacts 320) are comprised may vary between these components. As such, these components may have different coefficients of thermal expansion (CTEs). Thus, when these components are heated during the bonding process, they may expand at different rates. This may result in some lateral movement, Δx, between the light emitting structure 112 and backplane 310. This movement may cause one or more of the electrical contacts 206 to become misaligned with corresponding backplane contacts 320. In extreme cases, one or more electrical contacts 206 may lose physical contact with corresponding backplane contacts 320 entirely, in which case no bonds would be formed. For example, in some embodiments a diameter of the electrical contacts 206 and backplane contacts 320 may be between 0.5 μm and 4 μm (e.g., 3 μm). As such, lateral movement, Δx, exceeding that diameter (e.g., 3 μm) may result in the failure to form a bond between one or more of the electrical contacts 206 and one or more corresponding backplane contacts 320. Also, this may make it difficult to maintain a desirable amount of pressure between the light-emitting structure 112 and backplane 310 during bonding.

An additional issue that may arise during bonding is the potential damaging of mesas of light emitting structures 112. FIG. 4B is a diagram of a light emitting structure 112 with a mesa 410 located near the electrical contacts 206. As previously noted, a μLED may comprise a mesa 410 that can increase the efficiency of the μLED by directing light toward the light-emitting surface 208 of the light-emitting structure 112. As such, embodiments in which the light-emitting structure 112 comprises a plurality of μLEDs, the light-emitting structure 112 may also comprise a respective plurality of mesas 410. It can be further noted that, although the mesa 410 illustrated in FIG. 4B is located next to electrical contacts 206, alternative embodiments may include mesas 410 located under electrical contacts 206 (in which case an electrical contact 206 may extend from a surface of the mesa 410). Other embodiments may have mesas 410 disposed at other locations on the light-emitting structure 112.

Because the mesa 410 extends from the light-emitting structure 112 toward the backplane 310, it may be subject to damage during the bonding process. That is, during the bonding process, a force or pressure is applied to press the light-emitting structure 112 to the backplane 310 (e.g., downward in the Z direction, as shown in FIG. 4B). As previously noted, the components are heated up, so electrical contacts 206 and backplane contacts 320 may soften and compress. If the electrical contacts 206 and backplane contacts 320 compress to less than the mesa height 420, the mesa 410 may press against the backplane 310 and become damaged. In some embodiments, for example, mesa height 420 may be between 1 and 6 μm in height, and the combined height of the electrical contacts 206 and backplane contacts 320 could be between 1.5 and 10 μm in height.

Figure 5A:
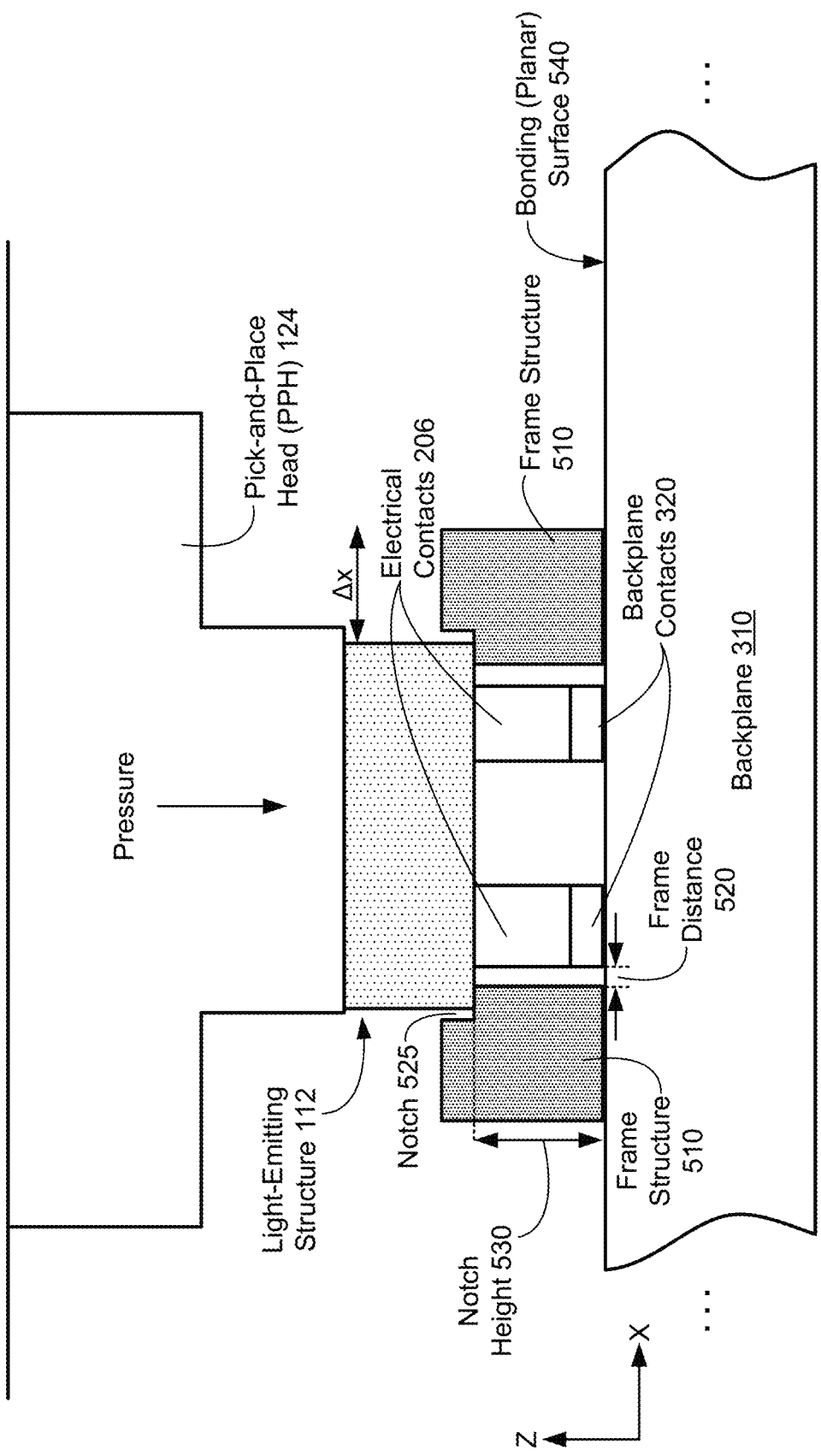
FIGS. 5A and 5B are cross-sectional views of a light-emitting structure, backplane, and frame structures during a bonding process, according to embodiments.
Figure 5B:
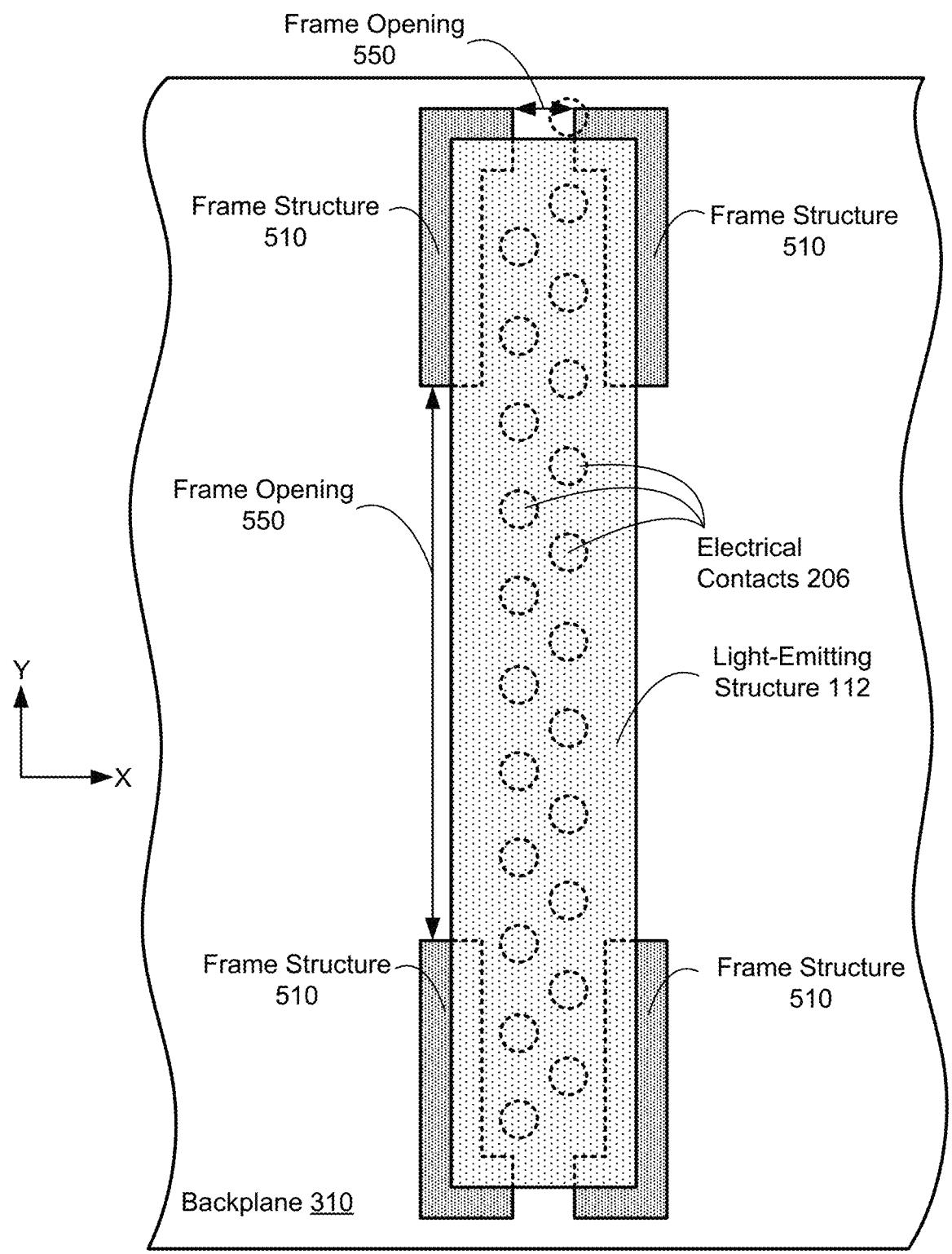

Embodiments address these and other issues by utilizing techniques for forming a frame on the backplane comprising structures at least partially circumscribing or enclosing backplane contacts 320 of the backplane 310. As used herein, the terms "circumscribing" and "enclosing" contacts (e.g., electrical contacts 206 and/or backplane contacts 320)

are meant to describe surrounding the contacts (either individually or jointly) on two or more sides. FIGS. 5A and 5B illustrate how a frame may be utilized, according to an embodiment.

FIG. 5A is a cross-sectional view of a light emitting structure 112, PPH 124, and backplane 310, similar to illustrations in FIGS. 3C-4B. Here, however, a frame is used during the bonding process. According to embodiments, the frame may comprise one or more frame structures 510 that can help reduce lateral movement, Δx, and/or reduce the amount of compression of the electrical contacts 206 and backplane contacts 320 (thereby reducing the likelihood that a mesa (not shown) may be damaged during the bonding process). Here, bonding surface 540 may comprise a substantially planar surface to which the backplane contacts 320 and one or more frame structures 510 are coupled.

The properties of the frame structures 510 may vary, depending on desired functionality. The frame itself may comprise a photoresist, and therefore may be created using corresponding photolithographic techniques. Alternative embodiments may utilize frames comprising additional or alternative materials.

According to some embodiments, each of the frame structures 525 may include a notch 530, which can serve to not only help reduce lateral movement, Δx, but also reduce the amount of compression of the electrical contacts 206 and backplane contacts 320. According to some embodiments, the dimensions of the notch 525 and frame distance 520 may be such that, if any lateral movement occurs, the body of the light emitting structure 112 presses against the frame structure 510 rather than the electrical contacts 206. This can help prevent shearing of the electrical contacts 206.

Depending on the processes used for fabricating the frame structures 510, a frame distance 520 from a frame structure 510 to the backplane contacts 320 and/or a notch height 530 from the bonding surface 540 of the backplane 310 may vary, and may be deliberately controlled, depending on desired functionality.

For example, a frame distance 520 may be deliberately included to allow some lateral movement, Δx. This can reduce the risk that lateral movement may shear the electrical contacts 206 from the light-emitting structure 112. In some embodiments, for example, frame distance 520 may be less than a diameter of the backplane contacts 320 and/or electrical contacts 206. This can help ensure the electrical contacts 206 remain in contact with corresponding backplane contacts 320 during the bonding process.

The notch height 530 may also be deliberately controlled to ensure proper bonding between the electrical contacts 206 and the backplane contacts 320, without an undesirable amount of compression. In some embodiments, for example, the notch height 530 may be less than a combined height of the electrical contacts 206 and backplane contacts 320, but the notch height 530 may also exceed the height of a mesa (not shown) of the light-emitting structure 112, to provide a physical stop that helps ensure the mesa does not become damaged during the bonding process due to overcompression.

FIG. 5B is an overhead view of the light emitting structure 112, frame structures 510 and backplane 310 illustrated in FIG. 5A. Here, the light-emitting structure 112 is elongated in the Y direction and may comprise a plurality of μLEDs (not shown), each having one or more electrical contacts 206. As previously noted, however, embodiments of a light-emitting structure may include more or fewer μLEDs, electrical contacts 206, and/or rows of electrical contacts 206, depending on desired functionality. (It can be further noted that, for clarity, not all electrical contacts 206 or frame openings 550 are labeled.)

As illustrated, the frame comprises a plurality of frame structures 510, which can at least partially enclose the electrical contacts 206. Although some embodiments may comprise a frame having a single frame structure 510 that fully encloses the electrical contacts 206, other embodiments may include one or more frame openings 550 between the frame structures 510, which may allow access to the electrical contacts and/or other components inside the frame structure 510 in subsequent fabrication processes.

For example, some embodiments may include the deposition of an underfill after the light emitting structure 112 is bonded to the backplane 310. The underfill may comprise a polymer-based material, which may be a spin-coated layer that is deposited onto the backplane 310. Additionally or alternatively, the underfill may be dispensed by a needle or jetting after bonding. The frame openings 550 between the frame structures 510 can allow the layer of underfill to form beneath the light-emitting structure 112, the electrical contacts 206 and underlying backplane contacts 320 (not shown) to remove metal oxide (e.g., Cu, Sn, Al, etc.) from the electrical contacts 206 and backplane contacts 320 to form a better bond.

It can be noted that the utilization of a frame may vary from the embodiments described with respect to FIGS. 5A and 5B. Although a single light-emitting structure 112 is illustrated in FIGS. 5A and 5B, embodiments may include multiple light-emitting structures 112. Depending on the proximity of the light-emitting structures 112 on the backplane 310, some embodiments may share at least portions of a frame structure 510 between two or more adjacent light-emitting structures 112. Additionally or alternatively, frame structures 510 may be permanent or temporary, depending on materials used, available manufacturing capabilities, and/or other factors. That is, according to some embodiments, the frame structures 510 may be removed subsequent to bonding. In other embodiments, the frame structures 510 may remain permanently on the backplane 310.

FIGS. 6A-6E are simplified cross-sectional diagrams illustrating an alternative embodiment of a fabrication process that may further reduce the likelihood of harmful effects from lateral movement during bonding. It can be noted, however, that other embodiments may take steps in a different order than those shown in FIGS. 6A-6E.

Figure 6A:
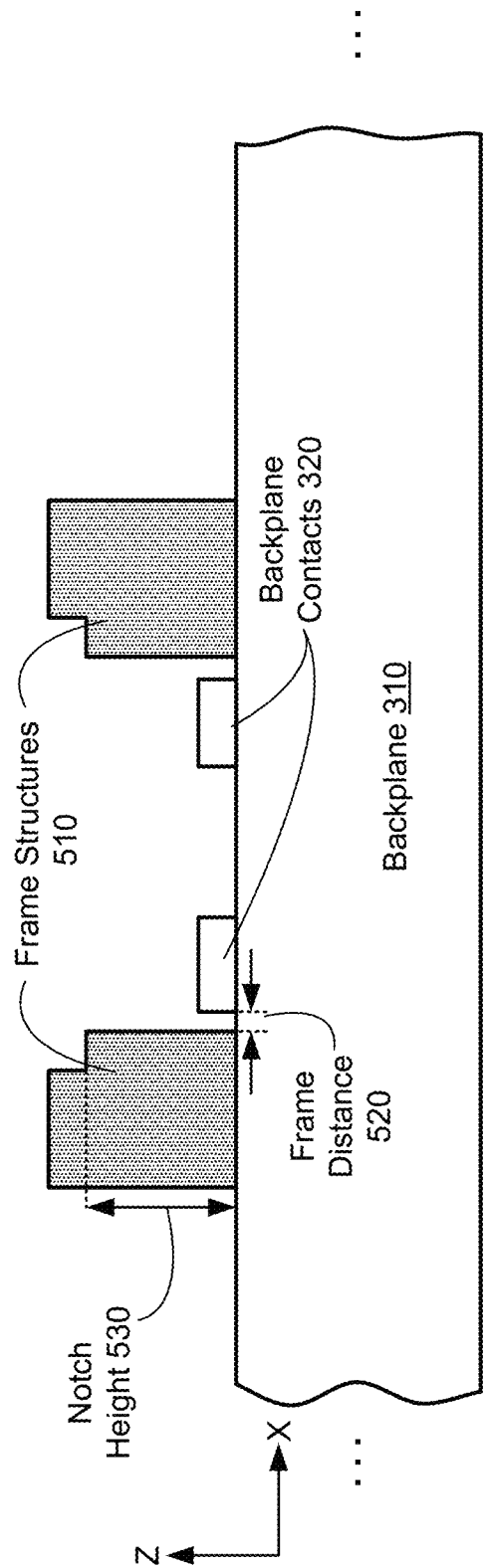
FIGS. 6A-6E are simplified cross-sectional diagrams illustrating an alternative embodiment of a fabrication process that may further reduce the likelihood of harmful effects from lateral movement during bonding.

FIG. 6A is simplified cross-sectional diagram of a backplane 310, backplane contacts 320, and frame structure 510. Here, similar to embodiments previously discussed, the frame may comprise a photoresist and may be fabricated on the backplane 310 using photolithographic processes. Additionally or alternatively, the frame structure may be formed using direct laser writing (e.g., two-photon polymerization). Again, notch height 530 and/or frame distance 520 may be controlled, at least to some degree, depending on desired functionality. According to embodiments, the frame structure 510 may be similar to the frame structure 510 illustrated in FIGS. 5A and 5B.

Figure 6B:
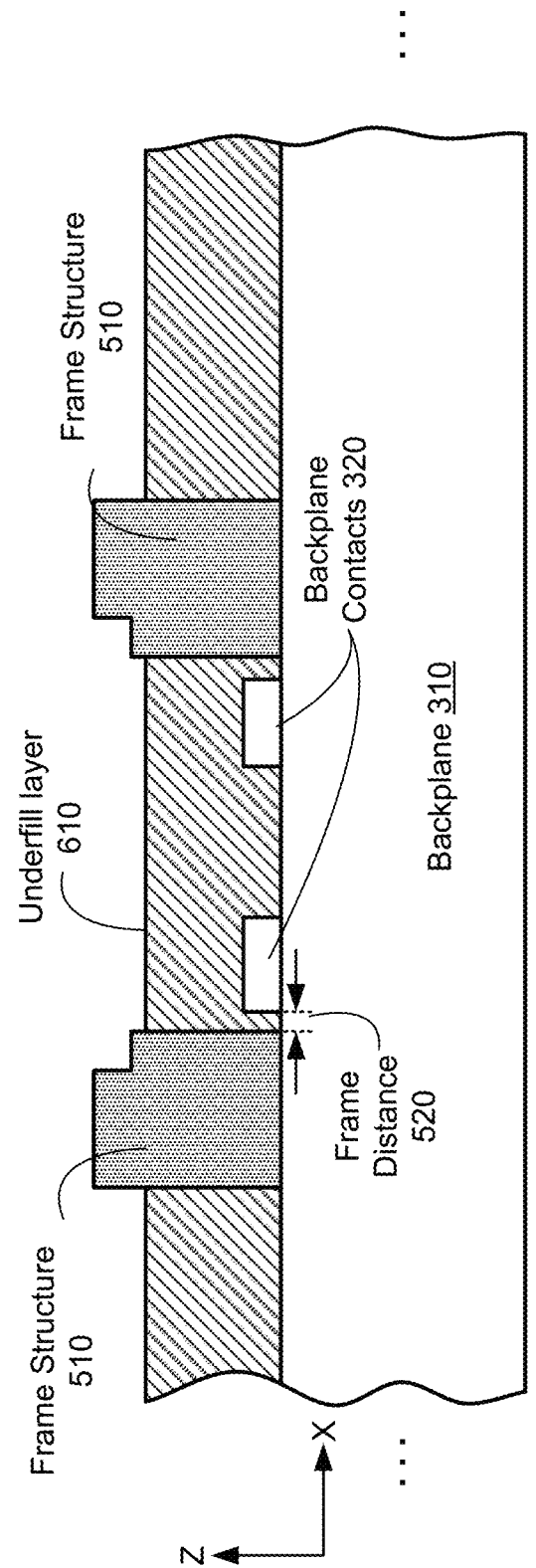

FIG. 6B illustrates a subsequent part of the fabrication process in which an underfill layer 610 may be deposited (or otherwise fabricated) on the backplane 310. Unlike the embodiment illustrated in FIGS. 5A and 5B, the underfill layer 610 may be deposited prior to placement of a light-emitting structure (not shown) on the backplane 310. As previously indicated, the underfill layer 610 may comprise a polymer-based material. Additionally or alternatively, the underfill layer 610 may be deposited using a spin-coating method. Where other materials are used, alternative techniques for fabricating the underfill layer 610 may be used.

Figure 6C:
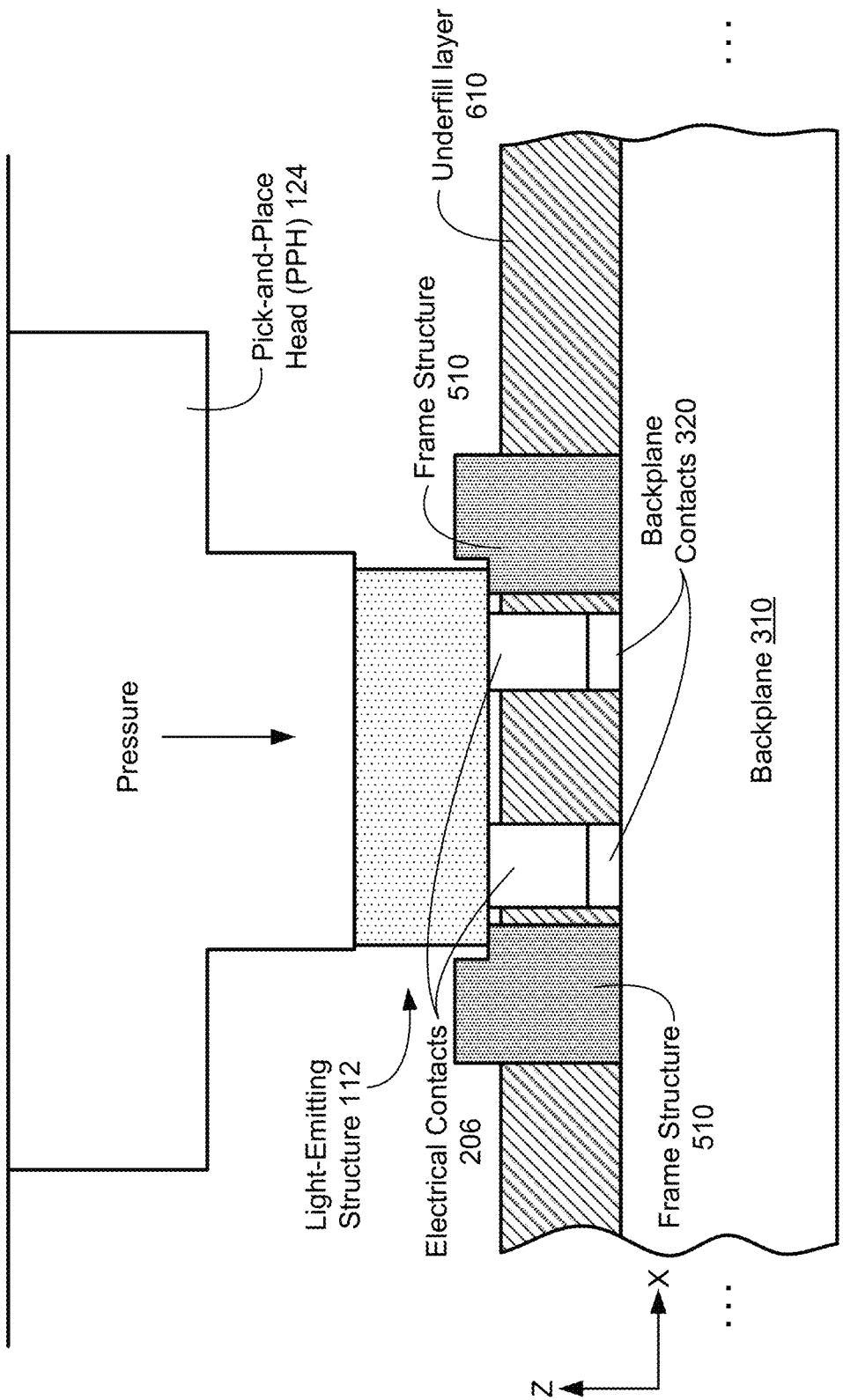

As illustrated further in FIG. 6C, the process can then include placing the light-emitting structure 112 onto the backplane 310 using the PPH 124. Here, the viscosity of the underfill layer 610 can allow the PPH 124 to simply press the light-emitting structure 112 at least partially into the underfill layer 610. For example, the light-emitting structure 112 can be pressed into the underfill layer 610 until the electrical contacts 206 press against the backplane contacts 320.

Figure 6D:
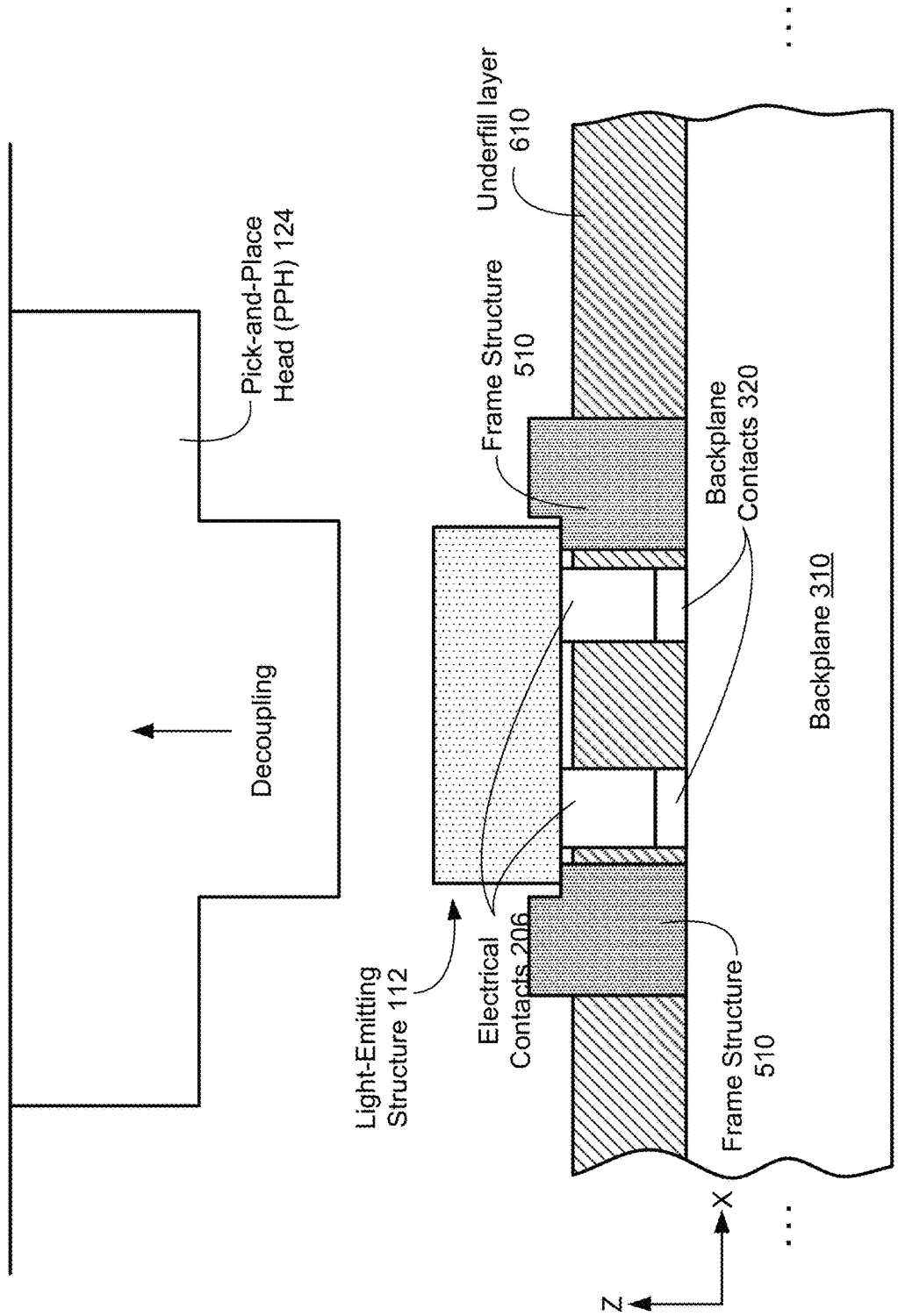

In FIG. 6D, the PPH 124 is then decoupled with the light-emitting structure 112. This decoupling may be made possible when the tackiness of the underfill layer 610 exceeds that of the PPH 124, retaining the light-emitting structure 112 in the underfill layer 610 while the PPH 124 is moved in a direction away from the backplane, as illustrated. As such, steps may be taken to ensure this condition is true. In some embodiments, for example, the extraction of the PPH 124 from the light-emitting structure 112 may not take place until the underfill layer 610 has cured, at least to some degree. Additionally or alternatively, steps may be taken to ensure a large amount of surface area of the light-emitting structure 112 is in contact with the underfill layer 610. Additional or alternative steps may also be taken to ensure decoupling of the PPH 124 with the light-emitting structure 112. In some embodiments, for example, the extraction of the PPH 124 from the light-emitting structure 112 may not take place until the electrical contacts 206 and backplane contacts 320 have formed a bond.

Figure 6E:
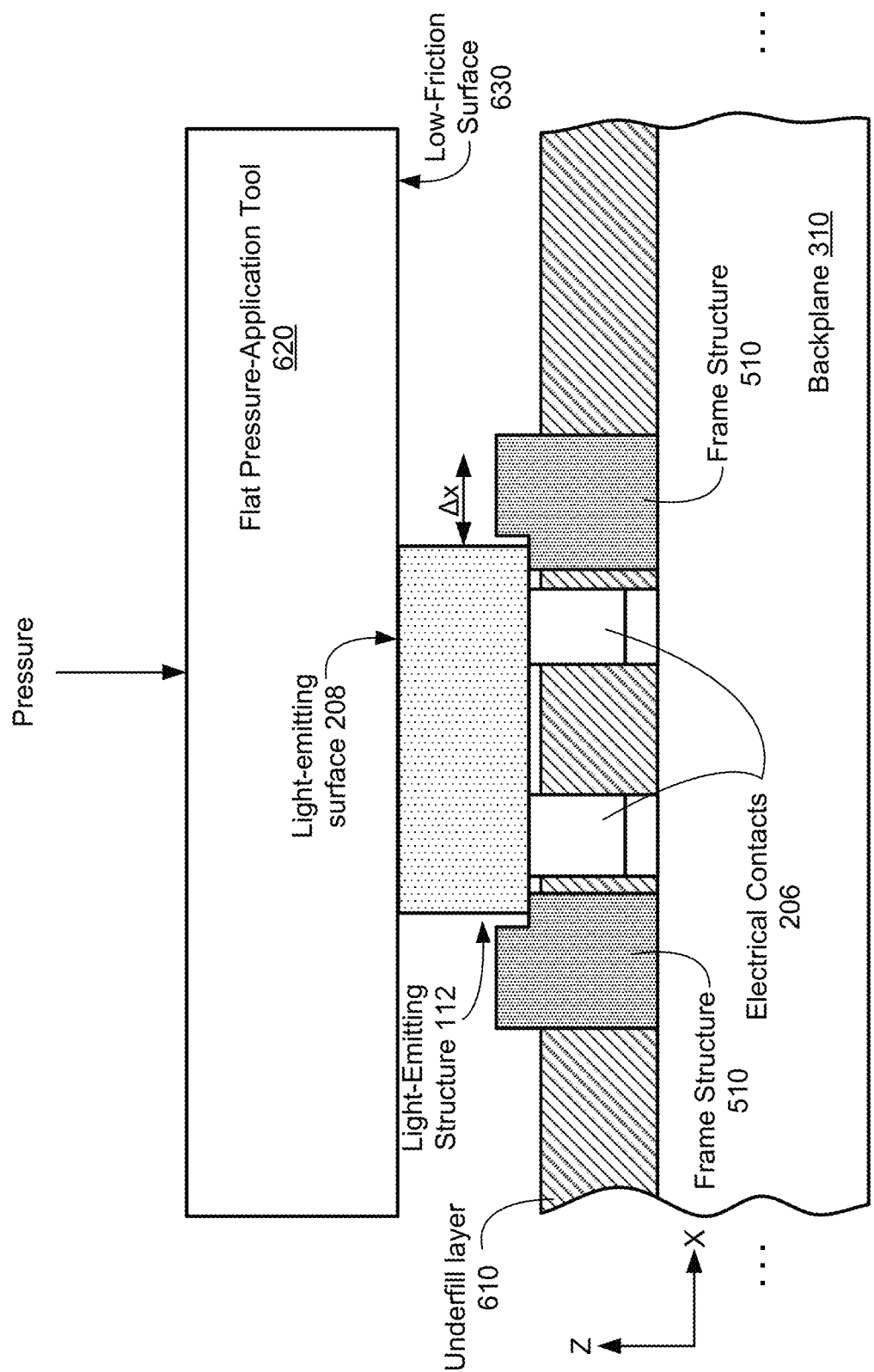

Finally, as shown in FIG. 6E, a flat pressure application tool can be used to press the light-emitting structure 112 to the backplane 310 during the bonding process. That is, the flat pressure-application tool 620 may be used to press against the light-emitting surface 208, pressing the light-emitting structure 112 to the backplane 310. As with other embodiments, the frame structure 510 can help prevent a mesa (not shown) from being damaged from overcompression during bonding and/or help reduce an amount of lateral movement, Δx, experienced by the light-emitting structure 112 during bonding.

In this embodiment, potential sharing of the electrical contacts 206 is further reduced, relative to other embodiments, through the use of the flat pressure-application tool 620. In particular, the flat pressure-application tool 620 may comprise a low-friction surface 630 in contact with the light-emitting surface 208 of the light-emitting structure 112. For example, in some embodiments, the flat pressure-application tool 620 may comprise a glass having an extremely low roughness (e.g., on the scale of nanometers). This can enable movement to occur between the flat pressure-application tool 620 and light-emitting structure 112 during the bonding process. The frame structure 510 can limit movement of the light-emitting structure 112 to help ensure proper bonding.

Figure 7:
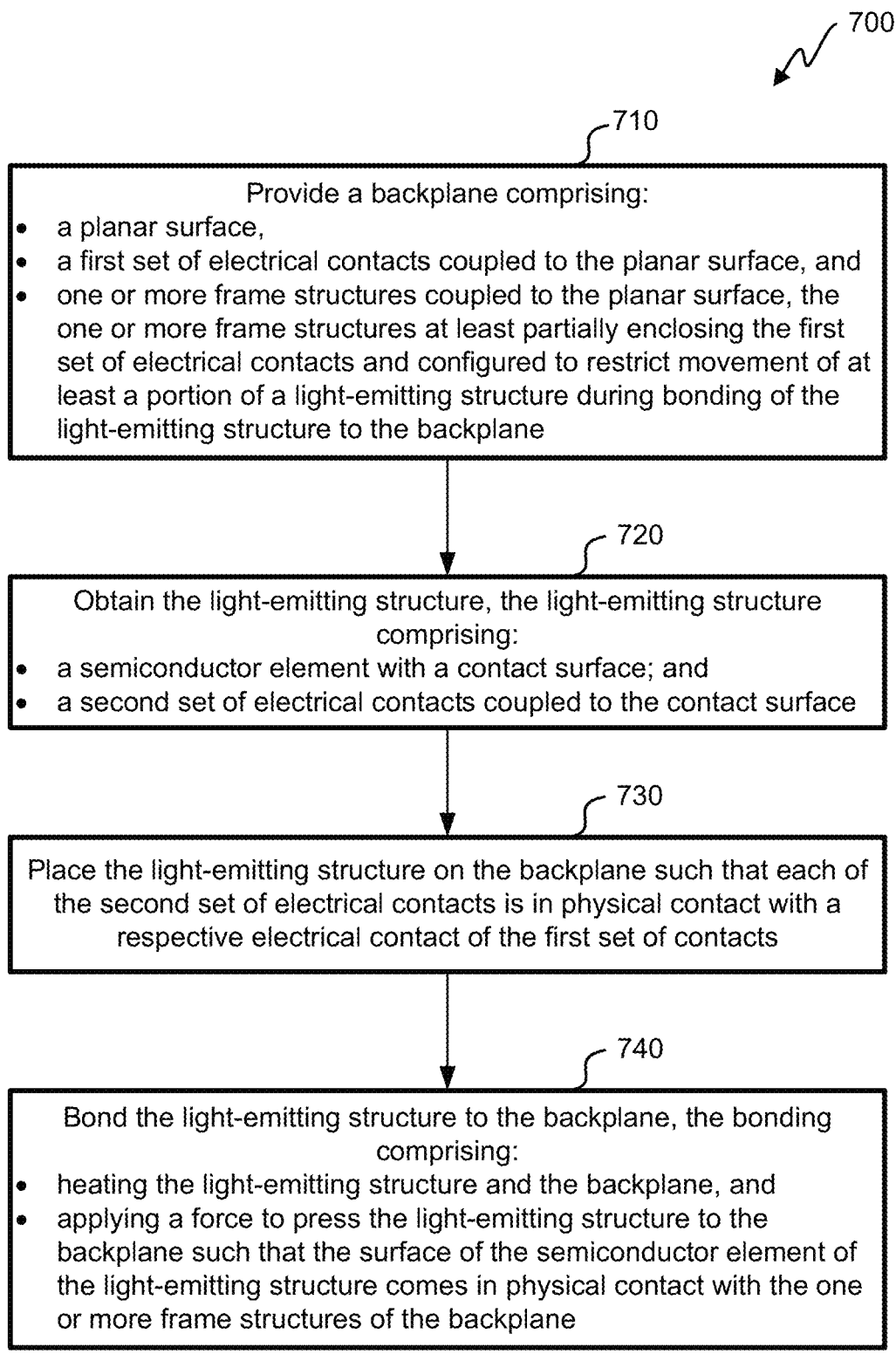
FIG. 7 is a flow diagram of a method of manufacturing a display, according to an embodiment.

FIG. 7 is a flow diagram of a method 700 of manufacturing a display, according to an embodiment. It can be noted that, similar to other figures herein, FIG. 7 is provided as a non-limiting example. Alternative embodiments may add, separate, rearrange, and/or otherwise alter the functionality of the blocks illustrated in FIG. 7. A person of ordinary skill in the art will recognize such alterations. Means for performing the method may include hardware and/or software components of a computing device, including controller 106 of FIG. 1 and associated components (e.g., processor 128, memory 130, actuator(s) 122, pick-and-place head array 104, and/or etcher 126).

At block 710, the functionality includes providing a backplane comprising a planar surface, a first set of electrical contacts coupled to the planar surface, and one or more frame structures coupled to the planar surface at least partially enclosing the first set of electrical contacts and configured to restrict movement of at least a portion of a light-emitting structure during bonding of the light-emitting structure to the backplane. As noted in the embodiments described above, materials utilized in the backplane, frame structures, and/or first set of electrical contacts, may vary, depending on desired functionality. For instance, the first set of electrical contacts (e.g., backplane contacts 320 illustrated in FIGS. 3B-5A and 6A-6E) may comprise Cu, Au, and/or other conductive materials. The one or more frame structures may comprise a photoresist material. And as such, providing a backplane may, in some embodiments, comprise fabricating the one or more frame structures utilizing a photolithographic process. The one or more frame structures can be configured to restrict movement a semiconductor element and/or electrical contacts of a light-emitting structure.

The dimensions and locations of the one or more frame structures may vary, depending on desired functionality. For instance, the one or more frame structures may be located at a distance from the first set of electrical contacts to allow for a threshold amount of movement between the light-emitting structure and the backplane in a direction parallel to the surface of the backplane during the bonding of the light-emitting structure to the backplane, as illustrated in FIG. 5A, for example. In some embodiments, the one or more frame structures may comprise a plurality of discrete frame structures that may be used to support a single light-emitting structure and may be separated by a frame opening (e.g., as illustrated in FIG. 5B). In some embodiments, the one or more frame structures extend a first height from the surface of the backplane, the light-emitting structure further comprises a mesa extending a second height from the surface of the semiconductor element; and the first height is greater than the second height.

At block 720, the method 700 further comprises obtaining the light-emitting structure, the light-emitting structure comprising a semiconductor element with a contact surface and a second set of electrical contacts coupled to the contact surface. As noted in the embodiments described previously, the second set of electrical contacts (e.g., electrical contacts 206 illustrated in FIGS. 2A-5B and 6C-6E) may comprise Cu, Sn, Au, and/or other conductive materials. The semiconductor element may vary in composition, which may depend on the color of light the light hiking emitting structure is intended to emit. According to various embodiments, for example, the semiconductor element may comprise gallium nitride (GaN), gallium arsenide (GaAs), AlInGaP, and/or other semiconductor materials (silicon (Si), etc.). As noted in the above-described embodiments, obtaining a light-emitting structure may comprise decoupling the light-emitting structure from a carrier substrate after a singulation process by using a PPH, as illustrated in FIG. 3A, for example.

At block 730, the method 700 includes placing the light-emitting structure on the backplane such that each of the second set of electrical contacts is in physical contact with a respective electrical contact of the first set of electrical contacts. As illustrated in FIGS. 3B and 3C and described above, aligning contacts of a light-emitting structure's respective contacts of a backplane can help ensure proper bonding. Minimum tolerances may be set below a diameter of an electrical contact (from the first set of electrical contacts and/or from the second set of electrical contacts) to help ensure contacts are physically touching.

At block 740 the light-emitting structure is bonded to the backplane. Here, the bonding comprises heating the light-emitting structure and the backplane and applying a force to press the light-emitting structure to the backplane such that the surface of the semiconductor element of the light-emitting structure comes in physical contact with the one or more frame structures of the backplane. According to some embodiments, applying the force to press the light-emitting structure to the backplane may comprise applying the force using a pick-and-place head with which the light-emitting structure is coupled, as illustrated in FIG. 5A, for example.

According to embodiments, the method 700 may include one or more additional functions, depending on desired functionality. For example, as noted in FIGS. 6A-6E, some embodiments may include depositing a layer of underfill with flux or without flux properties on the surface of the backplane prior to bonding the light-emitting structure to the backplane. In such embodiments, placing the light-emitting structure on the backplane may further comprise pressing the light-emitting structure at least partially into the layer of underfill using a pick-up head with which the light-emitting structure is coupled. In some embodiments, the layer of underfill may comprise a polymer-based material. In some embodiments, the layer of underfill may comprise a polymer-based material filled with nanoparticles (nanofillers). Other embodiments may use a polymer-based material without nanoparticles. Embodiments may further comprise decoupling the light-emitting structure from the pick-up head, and applying the force to press the light-emitting structure to the backplane may comprise using a pressure-application tool to apply pressure to a light-emitting surface of the light-emitting structure (e.g., as illustrated in FIG. 6E). In such embodiments, a friction level between a surface of the pressure-application tool in physical contact with the light-emitting surface of the light-emitting structure can allow for movement between the surface of the pressure-applying substrate and the light-emitting surface of the light-emitting structure during the bonding the light-emitting structure to the backplane. Optionally, the pressure-application tool may comprise glass or fused silica.

Figure 8:
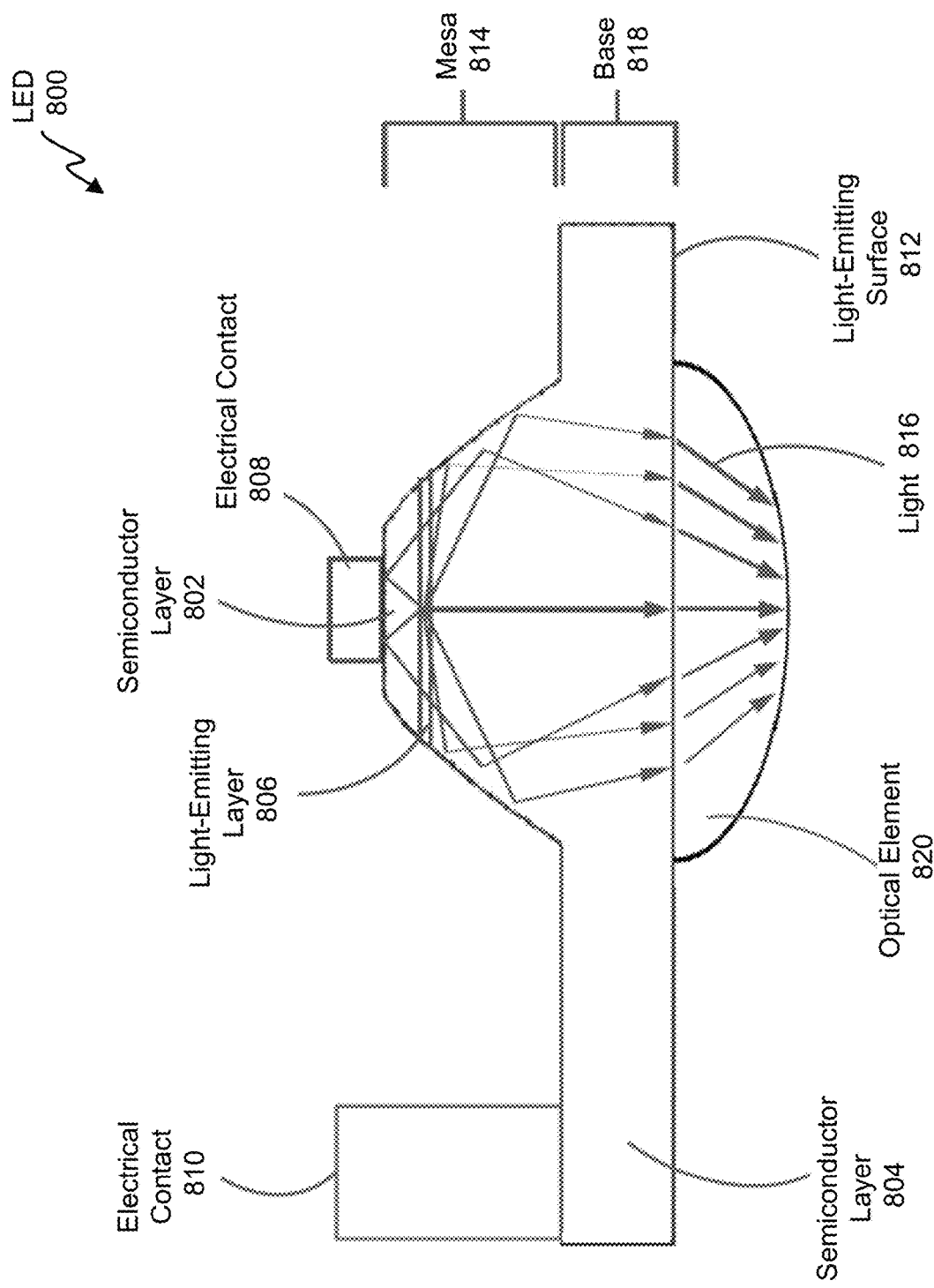
FIG. 8 is a cross-sectional view of an example LED, according to an embodiment.

FIG. 8 is a cross-sectional view of an example LED 800, which may be incorporated into a light-emitting structure 112 as described herein, according to some embodiments. The LED 800 may be a micro-LED, which may have an active light-emitting area 806 with a linear dimension that is less than 50 µm, less than 20 µm, or less than 10 µm. For example, the linear dimension may be as small as 2 µm or 4 µm. Their small size enables a display system to have a single pixel including three micro-LEDs: a red micro-LED, a green micro-LED, and a blue micro-LED. Their small size also enables micro-LEDs to be lightweight, making them particularly suitable for use in wearable display systems, such as watches and computing glasses. Although only one LED 800 is shown in FIG. 8, a plurality of LEDs may be formed simultaneously in a light-emitting structure, as illustrated in FIG. 2B.

The LED 800 includes, among other components, a semiconductor structure. The semiconductor structure includes semiconductor layers 802 and 804 and a light-emitting layer 806 that sits between the semiconductor layers 802 and 804. For example, the LED 800 may include a semiconductor structure in which the light-emitting layer 806 is a layer of indium gallium nitride that is sandwiched between a layer of p-type gallium nitride and a layer of n-type gallium nitride. In some embodiments, semiconductor layer 802 is a p-type semiconductor, and semiconductor layer 804 is an n-type semiconductor. In some embodiments, semiconductor layer 802 is an n-type semiconductor, and semiconductor layer 804 is a p-type semiconductor.

The semiconductor layers 802 and 804 are operatively coupled to electrical contacts 808 and 810, respectively (which may correspond to electrical interconnects 206 of the light-emitting structure 112, as illustrated in FIG. 2A). The electrical contacts 808 and 810 are typically made of a conductive material, such as a metallic material. In the example of FIG. 8, the electrical contacts 808 and 810 are both located on a top surface of the semiconductor structure such that they can both support the LED 800 when it is mounted on a substrate including a control circuit. However, in some embodiments, electrical contacts can be located on opposite surfaces of a semiconductor structure.

The light-emitting layer 806 includes one or more quantum wells that output light 816 when a voltage is applied across the electrical contacts 808 and 810. To directionalize the output of light 816, the semiconductor structure may be formed into any of a variety of shapes (e.g., a paraboloid, a cylinder, or a cone) that enable collimation/quasi-collimation of light 816. Such shapes are referred to herein as "mesa" shapes; and collimation and quasi-collimation are collectively referred to herein as "collimation". Collimation results in increased brightness of light output.

In the example of FIG. 8, mesa 814 corresponds to a paraboloid shape that guides light 816 toward through a light-emitting surface 812 of the semiconductor structure. More specifically, the light-emitting layer 806 is approximately positioned at the focal point of the paraboloid such that some of the emitted light is reflected, within a critical angle of total internal reflection, off the inner walls of the paraboloid toward the light-emitting surface 812.

In some embodiments, a mesa shape also has a truncated top that can accommodate an electrical contact. In the example of FIG. 8, mesa 814 corresponds to a paraboloid shape having a truncated vertex that accommodates electrical contact 808. Base 818 refers to the part of the semiconductor structure that is not included in the mesa 814.

To enable further collimation of light 816, an optical element 820 can be formed on the light-emitting surface 812. In the example of FIG. 8, the optical element 820 is a microlens. As will be described in greater detail below, the optical element 820 can be formed from an elastomeric material or a photoresist.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method of manufacturing a display, the method comprising:
    providing a backplane comprising:
        a planar surface;
        a first set of electrical contacts coupled to the planar surface; and
        one or more frame structures coupled to the planar surface, wherein:
            the one or more frame structures at least partially enclose the first set of electrical contacts;
            the one or more frame structures comprise:
                a first contact surface coupled to the planar surface, and
                first and second surfaces opposite the first contact surface forming a notch; and
            during bonding of a light-emitting structure to the backplane:
                at least a portion of the first surface is in contact with the light-emitting structure, and
                the second surface is not in contact with the light-emitting structure; and
    obtaining the light-emitting structure, the light-emitting structure comprising:
        a semiconductor element with a second contact surface; and
        a second set of electrical contacts coupled to the second contact surface;
    placing the light-emitting structure on the backplane such that each electrical contact of the second set of electrical contacts is in physical contact with a respective electrical contact of the first set of electrical contacts; and
    bonding the light-emitting structure to the backplane, the bonding comprising:
        heating the light-emitting structure and the backplane; and
        applying a force to press the light-emitting structure to the backplane.

2. The method of claim 1, wherein the applying the force to press the light-emitting structure to the backplane is such that the surface of the semiconductor element of the light-emitting structure comes in physical contact with the one or more frame structures of the backplane.

3. The method of claim 1, wherein the one or more frame structures comprises a photoresist material.

4. The method of claim 1, wherein applying the force to press the light-emitting structure to the backplane comprises applying the force using a pick-and-place head with which the light-emitting structure is coupled.

5. The method of claim 1, further comprising, prior to bonding the light-emitting structure to the backplane, depositing a layer of underfill on the surface of the backplane, wherein placing the light-emitting structure on the backplane further comprises pressing the light-emitting structure at least partially into the layer of underfill using a pick-and-place head with which the light-emitting structure is coupled.

6. The method of claim 5, further comprising decoupling the light-emitting structure from the pick-and-place head, wherein applying the force to press the light-emitting structure to the backplane comprises using a pressure-application tool to apply pressure to a light-emitting surface of the light-emitting structure.

7. The method of claim 6, wherein a friction level between a surface of the pressure-application tool in physical contact with the light-emitting surface of the light-emitting structure allows for movement between the surface of the pressure-applying substrate and the light-emitting surface of the light-emitting structure during the bonding of the light-emitting structure to the backplane.

8. The method of claim 6, wherein the pressure-application tool comprises glass or fused silica.

9. The method of claim 5, wherein the layer of underfill comprises a polymer-based material.

10. The method of claim 1, wherein:
   the one or more frame structures extend a first height from the surface of the backplane;
   the light-emitting structure further comprises a mesa extending a second height from the surface of the semiconductor element; and
   the first height is greater than the second height.

11. The method of claim 1, wherein the one or more frame structures are located at a distance from the first set of electrical contacts to allow for a threshold amount of movement between the light-emitting structure and the backplane in a direction parallel to the surface of the backplane during the bonding of the light-emitting structure to the backplane.

12. The method of claim 1, wherein the one or more frame structures comprise a plurality of discrete frame structures.

\* \* \* \* \*